US011610034B2

(12) United States Patent
Mikelsons et al.

(10) Patent No.: US 11,610,034 B2
(45) Date of Patent: Mar. 21, 2023

(54) METHOD AND DEVICE FOR SYNCHRONIZING A SIMULATION WITH A REAL-TIME SYSTEM

(71) Applicant: Robert Bosch GmbH, Stuttgart (DE)

(72) Inventors: Lars Mikelsons, Stadtbergen (DE); Michael Baumann, Sindelfingen (DE); Oliver Kotte, Stuttgart (DE); Peter Baumann, Leinfelden-Echterdingen (DE)

(73) Assignee: ROBERT BOSCH GMBH, Stuttgart (DE)

(*) Notice: Subject to any disclaimer, the term of this patent is extended or adjusted under 35 U.S.C. 154(b) by 497 days.

(21) Appl. No.: 16/637,579

(22) PCT Filed: Aug. 3, 2018

(86) PCT No.: PCT/EP2018/071186
§ 371 (c)(1),
(2) Date: Feb. 7, 2020

(87) PCT Pub. No.: WO2019/034453
PCT Pub. Date: Feb. 21, 2019

(65) Prior Publication Data
US 2020/0257835 A1  Aug. 13, 2020

(30) Foreign Application Priority Data

Aug. 14, 2017  (DE) .......................... 102017214125.5

(51) Int. Cl.
G06F 30/20  (2020.01)
B60R 16/023  (2006.01)
(Continued)

(52) U.S. Cl.
CPC .......... *G06F 30/20* (2020.01); *B60R 16/0231* (2013.01); *G01M 15/00* (2013.01); *G06F 1/12* (2013.01); *G06F 1/14* (2013.01)

(58) Field of Classification Search
CPC ... G06F 30/20; G06F 1/12; G06F 1/14; G06F 30/33; G06F 9/52; B60R 16/0231;
(Continued)

(56) References Cited

U.S. PATENT DOCUMENTS 5,764,953 A * 6/1998 Collins .................. G06Q 10/06
712/43
7,774,172 B1 * 8/2010 Yunt ........................ G06F 8/34
703/2

(Continued)

FOREIGN PATENT DOCUMENTS

| CN | 111505965 B | * | 9/2020 | ............ B60W 40/10 |
| DE | 10303489 A1 | | 8/2004 | |
| DE | 102015200300 A1 | | 7/2016 | |

OTHER PUBLICATIONS

International Search Report for PCT/EP2018/071186, dated Nov. 15, 2018.

*Primary Examiner* — Sam K Ahn
*Assistant Examiner* — Amneet Singh
(74) *Attorney, Agent, or Firm* — Norton Rose Fulbright US LLP; Gerard Messina

(57) ABSTRACT

A method for synchronizing a simulation of a simulation model on a computer with a real-time system, the simulation and the real-time system each having a computing clock having a matching macro increment. The method includes the following features: awaiting a message from the real-time system, measuring a receiving instant of the message by the simulation, awaiting at least one further message of the real-time system, measuring the receiving instant of the further message by the simulation; calculating an averaged (Continued)

receiving instant based on the receiving instants of the message and the at least one further message; determining a starting instant of the simulation based on the averaged receiving instant such that the results of a macro increment of the real-time system are available to the simulation at the start of a macro increment.

8 Claims, 2 Drawing Sheets

(51) Int. Cl.
*G01M 15/00* (2006.01)
*G06F 1/12* (2006.01)
*G06F 1/14* (2006.01)

(58) Field of Classification Search
CPC .. G01M 15/00; G01M 3/025; G01N 33/2817; G01R 31/006
See application file for complete search history.

(56) References Cited

U.S. PATENT DOCUMENTS

| | | | |
|---|---|---|---|
| 2005/0041765 A1* | 2/2005 | Dalakuras | G06F 13/4217 375/356 |
| 2009/0063120 A1 | 3/2009 | Babinsky et al. | |
| 2011/0015916 A1* | 1/2011 | Kataoka | G06F 30/15 703/19 |
| 2015/0323913 A1* | 11/2015 | Gilmore | G06Q 50/02 700/275 |
| 2016/0381068 A1* | 12/2016 | Galula | G07C 5/0816 726/23 |

* cited by examiner

METHOD AND DEVICE FOR SYNCHRONIZING A SIMULATION WITH A REAL-TIME SYSTEM

FIELD

The present invention relates to a method for synchronizing a simulation with a real-time system. In addition, the present invention relates to a corresponding device, a corresponding computer program as well as a corresponding storage medium.

BACKGROUND INFORMATION

Embedded systems have to rely on valid input signals from sensors and then in turn simulate their environment through output signals to a variety of different actuators. In the course of the verification and the preceding development phases of such a system, its model (model in the loop, MIL), software (software in the loop, SIL), processor (processor in the loop, PIL), or the entire hardware (hardware in the loop, HIL) is therefore simulated in a control loop together with a model of the environment. In the vehicle technology field, simulators for testing electronic control units that correspond to this principle are sometimes referred to as component, module or integration test stands, depending on the test phase and the test object.

German Patent No. DE 10303489 A1 describes such a method for testing software of a control unit of a vehicle, in which a test system at least partially simulates a controlled system that is able to be controlled by the control unit in that output signals are generated by the control unit and these output signals of the control unit are transmitted to first hardware components via a first connection, and signals from second hardware components are transmitted as input signals to the control unit via a second connection, the output signals being supplied as first control values in the software and are additionally transmitted to the test system via a communications interface in real time with respect to the controlled system.

United States Patent Application Publication NO. US 2009/0063120 A1 describes a system for executing a co-simulation or emulation of hardware and software. The system includes a hardware simulator with an integrated hardware model; a hardware or software environment for controlling the hardware simulator and for executing a software simulation or a direct software application; at least one synchronization device in the hardware model for outputting a request from the hardware or software environment; a receiver for setting the synchronization device into a predefined state; and a control for switching the hardware simulator between a free-running state and a query-handling state.

SUMMARY

The present invention provides an example method for synchronizing a simulation with a real-time system, a corresponding example device, a corresponding example computer program as well as a corresponding example storage medium.

The present invention is based on the understanding that in the further development process, the setup of expensive real prototypes is able to be further postponed by coupling engine test stands or other component test stands with offline simulation models for the purpose of a hardware validation, i.e. coupled simulations, which satisfy what is known as "soft real-time specifications". For example, this makes it possible to examine the influence of traffic and environmental conditions on the behavior of a real component on a test stand, such as the emissions of an internal combustion engine during an actual driving operation (real driving emissions, RDE). Using such a coupling of test stands with offline simulation models makes it possible to carry out these tests during the development phase without roadworthy experimental vehicles.

In addition, the provided approach is based on the understanding that delays occur in the data exchange in a coupling of offline simulation models and real-time systems, which may falsify the simulation result.

One advantage of an example embodiment of the present invention described below thus is the possible adaptation of the computing clock of the offline simulation to that of the real-time system in order to standardize the delays that occur during the data exchange. This makes the simulation results more reliable. In many instances, the standardization of the delays simultaneously corresponds to their minimization. The synchronization takes place at the start of the simulation so that delays are constant across the entire simulation run.

Advantageous further developments and improvements of the present invention are described herein.

BRIEF DESCRIPTION OF THE DRAWINGS

Exemplary embodiments of the present invention are shown in the figures and are described in greater detail below.

DETAILED DESCRIPTION OF EXAMPLE EMBODIMENTS

A coupling that is described herein by way of example is made up of two mutually independent components. One component (frequently a single-user computer with a suitable operating system) performs an offline simulation. The other component is a real-time system, e.g., an engine test stand. The offline simulation and the real-time system adapt their calculations to different trigger pulses. The computing clock $t_r, t_{r+1}, t_{r+2}, \ldots$ at which its calculations are running is specified through the start of the real-time system. The clock of the offline simulation $t_k, t_{k+1}, t_{k+2}, \ldots$ is similarly defined by the start of the offline simulation. The intervals between the respective trigger pulses are specified by a matching macro increment $\Delta T$. The starting points of the computing clocks, on the other hand, are independent of one another because the offline simulation and the real-time system are physically separated from each other. As a result, the computing clocks of the two components are randomly shifted with respect to each other during each simulation run.

Figure 1:
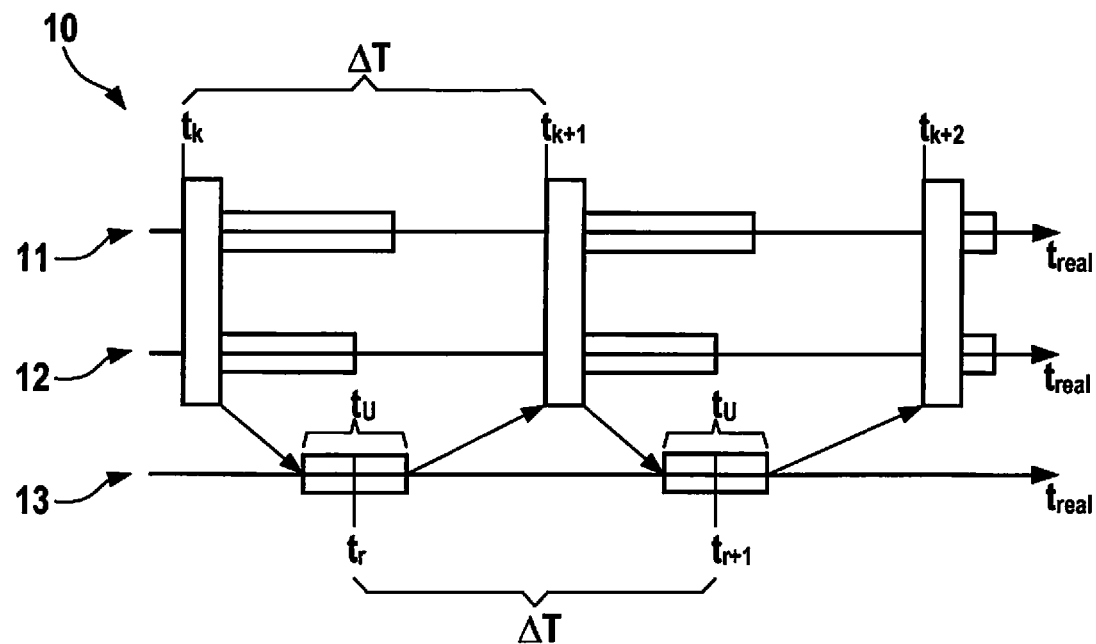
FIG. 1 shows a first simulation run in schematic form.
Figure 2:
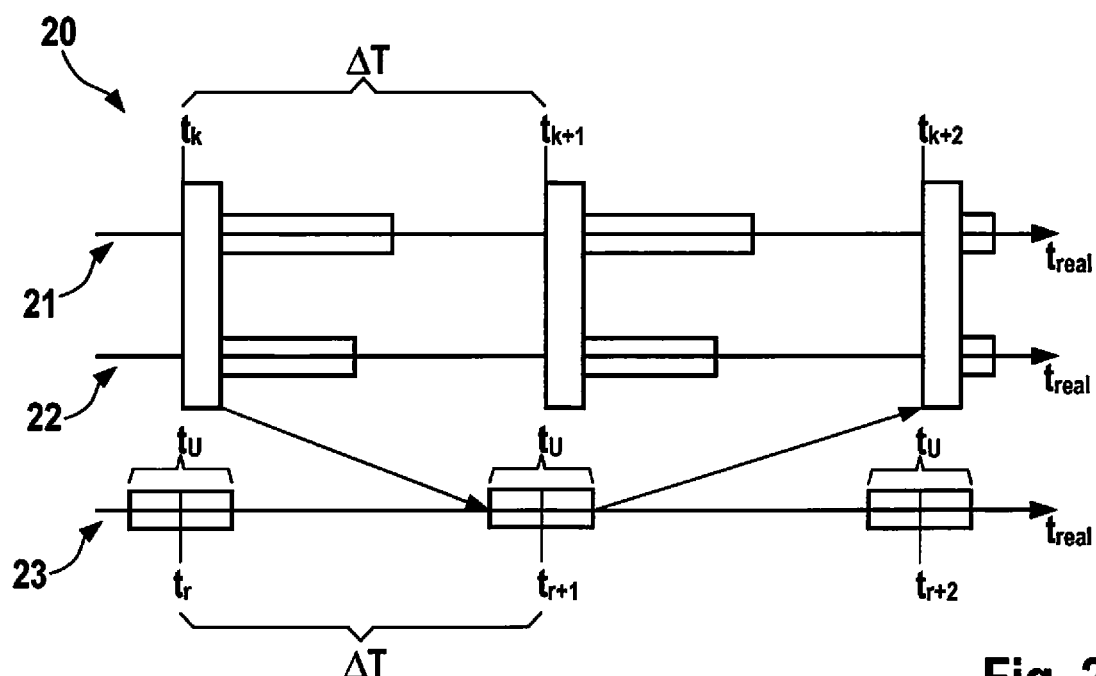
FIG. 2 shows a second simulation run in schematic form.

FIG. 1 and FIG. 2 illustrate the effect that such a mutual shift of the two computing clocks $t_r, t_{r+1}, t_{r+2}, \ldots$ and $t_k, t_{k+1}, t_{k+2}, \ldots$ has on the data exchange. The illustrated bars identify the time period of the calculations in the respective subsystems. Horizontal bars represent the computing period of the models of the offline simulation or the cycle time $t_U$, which is required for the communication with the real-time system; perpendicular bars identify the duration of the data exchange between the models of offline simulations 11, 12 or 21, 22, which is coordinated by the master of the offline simulation.

FIG. 1 shows a simulation run 10, in which the starting instants of the two computing clocks $t_r$, $t_{r+1}$, $t_{r+2}$, ... and $t_k$, $t_{k+1}$, $t_{k+2}$, ... behave in such a way towards each other that a data exchange within a macro time increment $\Delta T$ is possible. Values of offline simulations 11, 12 at instant $t_k$ are thereby able to be processed by real-time system 13 at instant $t_r$, under consideration of cycle time $t_U$, and its results are available again to offline simulations 11, 12 at instant $t_{k+1}$.

FIG. 2 shows a simulation run 20 in which the starting instants of the computing clocks $t_r$, $t_{r+1}$, $t_{r+2}$, ... and $t_k$, $t_{k+1}$, $t_{k+2}$, ... behave in a disadvantageous manner towards one another. Here, values of offline simulations 21, 22 at instant $t_k$ are unable to be processed by real-time system 23 at instant $t_r$, due to cycle time $t_U$, and its results are therefore only available again to offline simulations 21, 22 at instant $t_{k+2}$. This doubles the delay during the data exchange across the entire simulation run to two macro increments $2\Delta T$.

The results of simulation runs during which the delay amounts to two increments $2\Delta T$ are considerably poorer than those that are obtained when the delay is shorter. A central aspect of the proposed approach thus is the synchronization of the two computing clocks $t_r$, $t_{r+1}$, $t_{r+2}$, ... and $t_k$, $t_{k+1}$, $t_{k+2}$, ... in order to optimize their position relative to each other and to standardize the delays. This avoids simulation runs during which the processing clocks $t_r$, $t_{r+1}$, $t_{r+2}$, ... and $t_k$, $t_{k+1}$, $t_{k+2}$, ... are positioned unfavorably relative to each other, as illustrated in FIG. 2. This ensures that the delays are minimized and standardized in all simulation runs.

Figure 3:
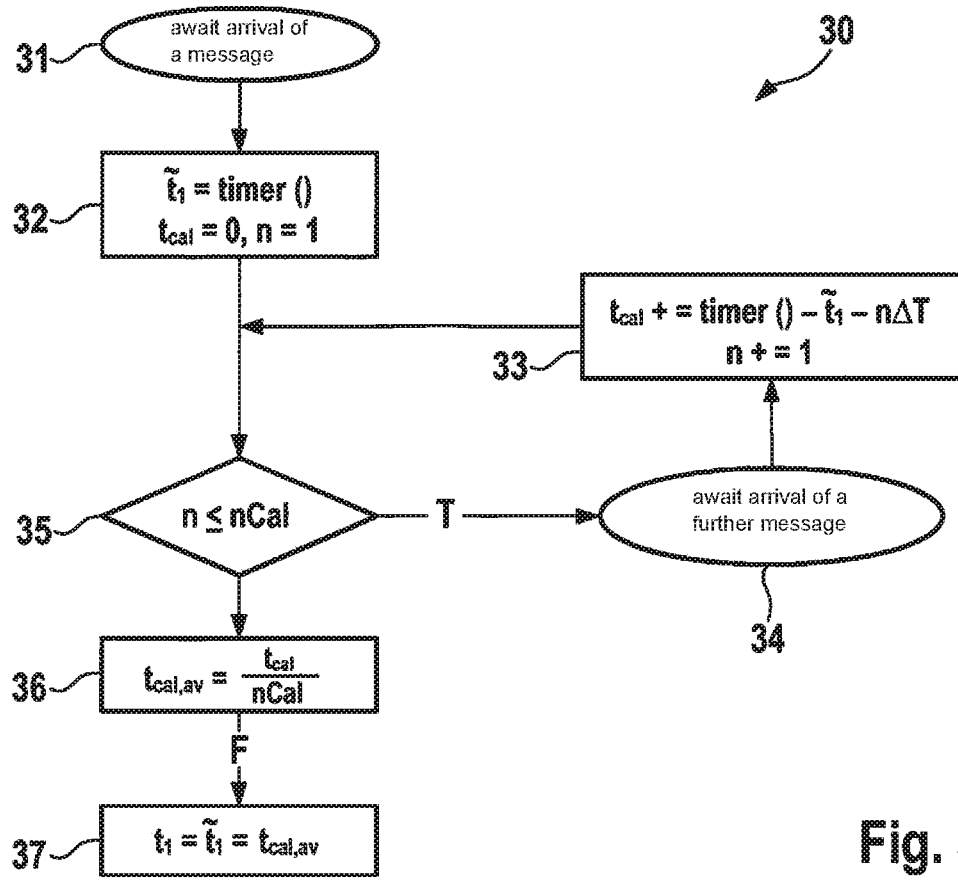
FIG. 3 shows a flow diagram of a method according to a specific embodiment of the present invention.

Toward this end, according to the method (30) illustrated in FIG. 3, the computing clock of the already running real-time system is ascertained at the beginning of the offline simulation and the computing clock of the offline simulation is adapted thereto prior to the start of the simulation. To do so, the clock $t_1+k\Delta T$ at which the offline simulation receives messages from the real-time system first has to be measured. With the aid of known cycle time $t_U$, the optimal computing clock of the offline simulation is able to be determined therefrom. Since macro increment $\Delta T$ is known as well, only starting instant $t_1$ needs to be determined in order to determine the clock.

For this purpose, first the arrival of a message from the real-time system (event 31) is awaited. Instant $t_1$ of this event is measured (process 32). Since a single time measurement may be imprecise, which should be taken into account when using a single-user computer for the execution of the method (30), for instance, the measurement (32) is averaged in the next step with the aid of further measurements (33). A further message (event 34) is awaited for this purpose, which should arrive precisely one macro increment $\Delta T$ after the previous message. The value of variables $t_{cal}$ is increased by the deviation between the measured and the expected times (process 33). This process is repeated (decision 35, branch T) until the number n of the processed messages corresponds to the provided random sampling scope nCal (decision 35, branch F). Then, the average deviation $t_{cal,av}$ of the further time measurements is ascertained (process 36). In the final step (process 37), $t_1$ is determined by deducting $t_{cal,av}$ from $t_1$. With knowledge of macro increment $\Delta T$, clock $t_1+k\Delta T$ at which messages are arriving from the real-time system is thus determined.

Figure 4:
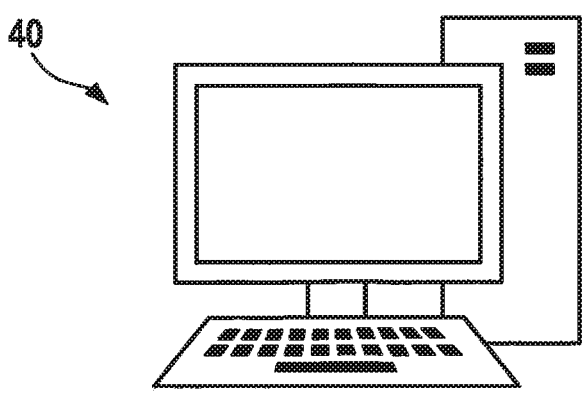
FIG. 4 shows, in schematic form, a single user computer according to a second specific embodiment of the present invention.

This method (30) may be implemented in software or hardware, for example, or in a mixed form of software and hardware such as in a single user computer (40) as illustrated by the schematic representation of FIG. 4.

What is claimed is:

1. A method for synchronizing a simulation with a real-time system, the method comprising the following steps:
   awaiting a message from the real-time system;
   measuring a receiving instant of the message;
   awaiting at least one further message of the real-time system;
   measuring a receiving instant of the further message;
   forming a time difference between the receiving instant of the message and the receiving instant of the further message;
   ascertaining a deviation of the time difference with respect to a predefined macro increment of the simulation; and
   based on the deviation, determining a starting instant of the simulation;
   wherein the method further comprising the following steps:
   processing a plurality of awaited message including the message and the at least one further message, by measuring a receiving instant of each awaited message and awaiting a further awaited message, for as long as a number of awaited messages processed does not reach a predefined random sampling scope;
   forming an average value of respective deviations between receiving instants of the processed awaited messages as soon as the number of processing awaited messages corresponds to the predefined random sampling scope; and
   determining the starting instant based on the average value.

2. The method as recited in claim 1, further comprising the following steps:
   forming a sum by accumulating the respective deviations; and
   determining the average value arithmetically by dividing the sum by the predefined random sampling scope.

3. The method as recited in claim 1, wherein the real-time system includes an engine test stand.

4. The method as recited in claim 3, wherein the message and the further message are transmitted via a controller area network (CAN) to the engine test stand.

5. The method as recited in claim 1, wherein the simulation is performed using a single-user computer.

6. The method as recited in claim 1, wherein the simulation is a co-simulation of a plurality of models.

7. A non-transitory machine-readable storage medium on which is stored a computer program for synchronizing a simulation with a real-time system, the computer program, when executed by a computer, causing the computer to perform the following steps:
   awaiting a message from the real-time system;
   measuring a receiving instant of the message;
   awaiting at least one further message of the real-time system;
   measuring a receiving instant of the further message;
   forming a time difference between the receiving instant of the message and the receiving instant of the further message;
   ascertaining a deviation of the time difference with respect to a predefined macro increment of the simulation; and based on the deviation, determining a starting instant of the simulation;

wherein the steps further comprise the following steps:

processing a plurality of awaited messages including the message and the at least one further message, by measuring a receiving instant of each awaited message and awaiting a further awaited message, for as long as a number of awaited messages processed does not reach a predefined random sampling scope;

forming an average value of respective deviations between receiving instants of the processed awaited messages as soon as the number of processing awaited messages corresponds to the predefined random sampling scope; and determining the starting instant based on the average value.

8. A device configured to synchronize a simulation with a real-time system, the device configured to:

await a message from the real-time system;

measure a receiving instant of the message;

await at least one further message of the real-time system;

measure a receiving instant of the further message;

form a time difference between the receiving instant of the message and the receiving instant of the further message;

ascertain a deviation of the time difference with respect to a predefined macro increment of the simulation; and based on the deviation, determine a starting instant of the simulation;

wherein the device is further configured to:

process a plurality of awaited messages including the message and the at least one further message, by measuring a receiving instant of each awaited message and awaiting a further awaited message, for as long as a number of awaited messages processed does not reach a predefined random sampling scope;

form an average value of respective deviations between receiving instants of the processed awaited messages as soon as the number of processing awaited messages corresponds to the predefined random sampling scope; and based on the average value determine the starting instant of the simulation.

* * * * *